(12) United States Patent
Baba-Ali et al.

(10) Patent No.: US 7,274,502 B2
(45) Date of Patent: Sep. 25, 2007

(54) SYSTEM, APPARATUS AND METHOD FOR MASKLESS LITHOGRAPHY THAT EMULATES BINARY, ATTENUATING PHASE-SHIFT AND ALTERNATING PHASE-SHIFT MASKS

(75) Inventors: Nabila Baba-Ali, Ridgefield, CT (US); Arno Bleeker, Westerhoven (DK)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 11/018,483

(22) Filed: Dec. 22, 2004

(65) Prior Publication Data

US 2006/0132887 A1    Jun. 22, 2006

(51) Int. Cl.
  *G02B 26/00* (2006.01)
(52) U.S. Cl. .................. 359/290; 359/291; 359/223; 359/224
(58) Field of Classification Search ............... 359/290, 359/291, 223, 224, 295; 355/53, 67, 71
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,835,256 A * | 11/1998 | Huibers ................. | 359/291 |
| 5,982,553 A | 11/1999 | Bloom et al. | |
| 6,133,986 A | 10/2000 | Johnson | |
| 6,177,980 B1 | 1/2001 | Johnson | |
| 6,178,284 B1 * | 1/2001 | Bergmann et al. .......... | 385/140 |
| 6,473,221 B2 * | 10/2002 | Ueda et al. ................. | 359/298 |
| 6,480,324 B2 * | 11/2002 | Quate et al. ................ | 359/298 |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 2004/0041104 A1 | 3/2004 | Liebregts et al. | |
| 2004/0057034 A1* | 3/2004 | Zinn et al. .................... | 355/67 |
| 2004/0130561 A1 | 7/2004 | Jain | |
| 2005/0007572 A1 | 1/2005 | George et al. | |
| 2005/0270613 A1* | 12/2005 | Hintersteiner et al. ...... | 359/237 |

FOREIGN PATENT DOCUMENTS

| | | |
|---|---|---|
| WO | WO 98/33096 | 7/1998 |
| WO | WO 98/38597 | 9/1998 |

OTHER PUBLICATIONS

D. W. Vidrine, Table VI. Properties of some reflective metals, 2002.*

* cited by examiner

*Primary Examiner*—Timothy Thompson
(74) *Attorney, Agent, or Firm*—Sterne, Kessler, Goldstein & Fox P.L.L.C.

(57) ABSTRACT

A tilting mirror design for maskless lithography is proposed. In this mirror, the tilting portion occupies about 60% of the entire element area. The surrounding space is made 100% reflective and out-of-phase with respect to the tilting portion. The ratio between the tilting portion of the mirror and the out-of-phase portion is optimized in order to result in equal positive and negative maximum amplitudes over a complete range of tilt angles.

25 Claims, 8 Drawing Sheets

SYSTEM, APPARATUS AND METHOD FOR MASKLESS LITHOGRAPHY THAT EMULATES BINARY, ATTENUATING PHASE-SHIFT AND ALTERNATING PHASE-SHIFT MASKS

BACKGROUND OF THE INVENTION

1. Field of the Invention

The present invention relates to a light patterning device and method of using the same.

2. Background Art

A patterning device is used to pattern light. A static patterning device can include reticles or masks. A dynamic patterning device can include an array of individually controllable elements that generate a pattern through receipt of analog or digital signals. Example environments for use of the patterning device can be, but are not limited to, a lithographic apparatus, a maskless lithographic apparatus, a projector, a projection display apparatus, or the like. The following discussion involves patterning devices in lithography, but can be extended to the aforementioned apparatuses, as would become apparent to persons having ordinary skill in the art.

Currently, arrays of individually controllable elements can include various types of mirrors. For example, piston mirrors, single phase-step tilting mirrors, flat tilting mirrors, or hybrid mirrors combining tilt and piston actions.

However, these arrays cannot effectively emulate phase shifting masks because of intensity modulation constraints (e.g., unequal maximum amplitude of positive and negative light) and/or are inefficient when correcting telecentric errors.

Individually, piston mirrors have a pure phase modulation effect, but amplitude modulation can also be obtained by combining piston mirrors into one large pixel. This results in a loss of resolution as well as limits the ability in replicating the effect of assist features (e.g., features intended to improve lithography on a customer wafer, for example, optical proximity correction features, serifs, hammerheads, scattering bars, anti-scattering bars, etc.) smaller than the largest pixel. There is also significant throughput loss with this approach.

Tilting mirrors are used to produce different amplitudes of reflected light at an image plane and/or collected (captured) at projection optics, in a lithography system, for example. At different phases, an amplitude of reflected light, as seen at an image plane and/or collected at projection optics, is considered to have positive or negative light amplitude. For example, when a mirror is untilted (e.g., resting) light at the image plane and/or collected at projection optics is considered to have a positive amplitude with zero phase. During tilting of the mirror, there is an tilt angle at which no light is directed toward the image plane and/or is collected at projection optics, so the amplitude of the light at the image plane goes to zero. Then, as the mirror continues to tilt, out of phase light reaches the image plane and/or is collected at projection optics, which is considered to be negative amplitude light.

When imaging with tilting mirrors, there can be a telecentricity error. Telecentricity can occur during patterning on an object as a pattern goes into and out of focus, and causes an image being formed to move/shift slightly.

One type of tilting mirror, discussed above, is a single phase step tilting mirror ($\lambda/4$ phase step or $\lambda/2$ phase step; where $\lambda$ is the wavelength of light or imaging wavelength), for example, proposed by Micronic Laser Systems of Sweden. This mirror can achieve an intensity modulation anywhere between about positive 50% and negative 50%. When at rest, no light enters a pupil of a projection system because, due to the step, half the light has a zero degree phase and the other half of the light has a 180 degree phase. As the mirror is tilted, light is captured or collected by the projection system, where a direction of tilt determines whether positive or negative light is captured or collected. Because of the symmetry of the single step mirror, equal amounts of positive and negative light can be captured or collected by the projection system. However, to correct for telecentric errors the one step mirror requires alternating the position of the step (right or left). This results in the dependence of the tilt angle sign on the position of the edge. This means that in order to achieve a given graytone with a particular mirror, the sign of the tilt angle needed will require knowledge of where the step is located, which creates an additional strain on the data path. In addition, mirror curling at the edges is likely to be exacerbated on the thinner side of the mirror and result in "tilt errors."

An alternative tilting mirror, also discussed above, is a flat tilting mirror, which can achieve an intensity modulation anywhere between 100% positive phase intensity and 4.7% negative phase intensity. This limited negative phase intensity has proven to be a major limitation in emulating alternating phase shifting masks without significant light loss. By design, the space between these mirrors is typically as small and opaque as the fabrication process allows.

Therefore, what is needed is an array of individually controllable elements, where each individually controllable element when used in the array has better positive and negative intensity characteristics and/or allows for effective and efficient telecentric error correction and/or does not decrease the throughput.

BRIEF SUMMARY OF THE INVENTION

According to an embodiment of the present invention, there is provided a system comprising an illumination system, an array of individually controllable elements, and a projection system. The illumination system supplies a beam of radiation. The array of individually controllable elements patterns the beam. The array of individually controllable elements comprises a tilting portion and a non-tilting portion. The projection system projects the patterned beam onto a target portion of an object.

According to an embodiment of the present invention, there is provided a patterning device comprising an array of first reflective portions, an array of second reflective portions, and an array of controllers. Each first reflective portion in the array of first reflective portions has a first area. Each second reflective portion in the array of second reflective portions has a second area. The second reflective portions can tilt through a predetermined range of tilt angles about an axis shared by the respective first and second reflective portions. The array of controllers are coupled to respective ones or subsets of the second reflective portions. The controllers control the tilt angle of the respective ones or subsets of second reflective portions.

According to an embodiment of the present invention, there is provided a device manufacturing method comprising the following steps. Patterning a beam of radiation using an array of individually controllable elements, each of the individual elements in the array having a first reflective region that tilts and a second reflective region. Projecting the patterned beam onto a target portion of an object, wherein each element produces substantially equal positive and negative maximum amplitudes of reflected light over a complete range of tilt angles.

Further embodiments, features, and advantages of the present invention, as well as the structure and operation of the various embodiments of the present invention, are described in detail below with reference to the accompanying drawings.

BRIEF DESCRIPTION OF DRAWINGS/FIGURES

The accompanying drawings, which are incorporated herein and form a part of the specification, illustrate embodiments of the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements.

DETAILED DESCRIPTION OF THE INVENTION

Overview

Figure 1:
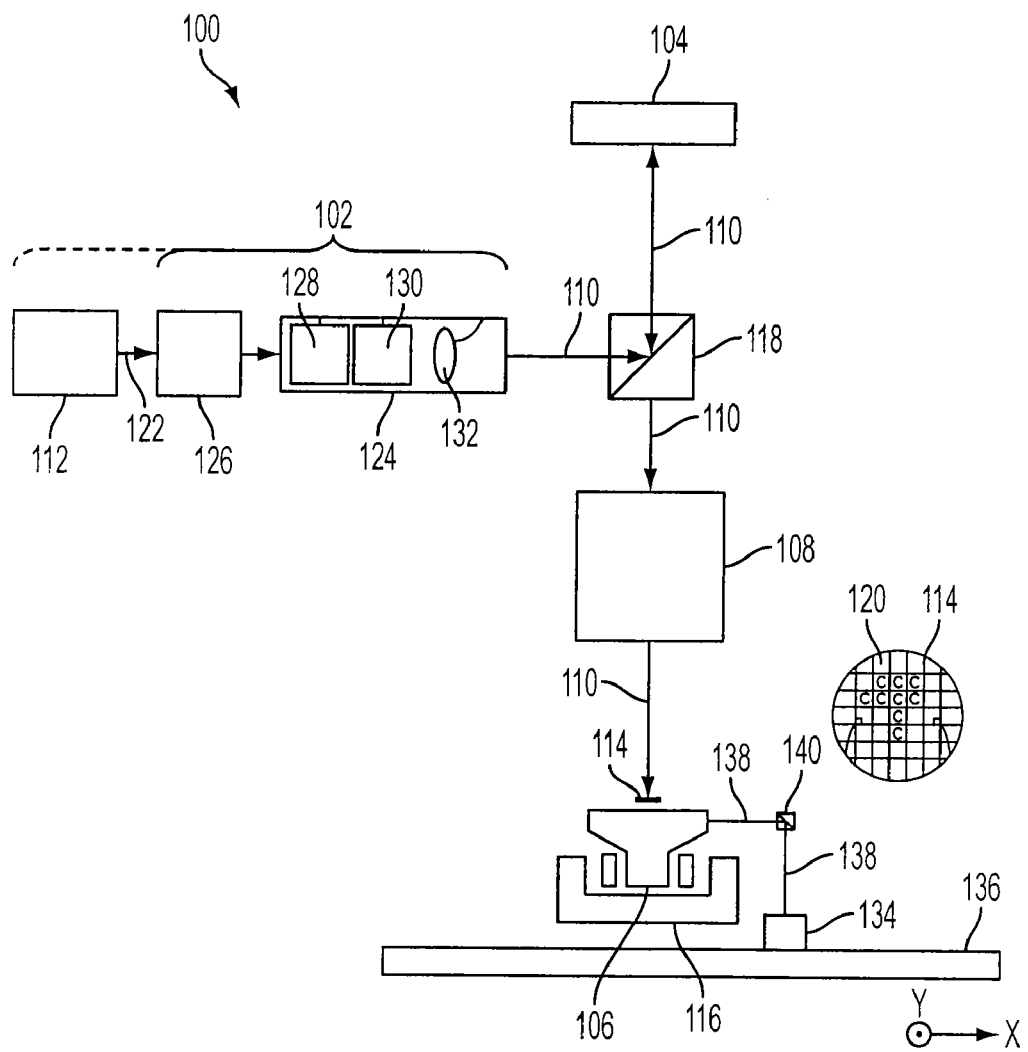
FIG. 1 depicts a lithographic apparatus, according to one embodiment of the invention.

Although specific reference may be made in this text to the use of a patterning device in a maskless lithographic system that patterns a substrate, it should be understood that the patterning device described herein may have other applications, such as in a projector or a projection system to pattern an object or display device (e.g., in a projection television system, or the like). Therefore, the use of the maskless lithographic system and/or substrate throughout this description is only to describe one embodiment of the present invention.

A system, apparatus and method of the present invention are used to pattern light using an illumination system, an array of individually controllable elements, and a projection system. The illumination system supplies a beam of radiation. The array of individually controllable elements patterns the beam. Each element in the array of individually controllable elements comprises a tilting portion and a non-tilting portion. The projection system projects the patterned beam onto a target portion of an object. In various examples, the object can be a display device, a semiconductor substrate or wafer, a flat panel display glass substrate, or the like.

In one example, the individually controllable elements are varied over a range of tilt angles. Over this range of tilt angles substantially equal positive and negative maximum amplitudes of light are produced at an image plane. The substantially equal positive and negative maximum amplitudes allow sharper images to be formed by the array of individually controllable elements at the image plane, which is where the object is located.

Terminology

Although specific reference may be made in this description to the use of lithographic apparatus in the manufacture of integrated circuits (ICs), it should be understood that the lithographic apparatus described herein may have other applications, such as, for example, the manufacture of DNA chips, micro electrical mechanical systems (MEMS), micro optical electrical mechanical systems (MOEMS), integrated optical systems, guidance and detection patterns for magnetic domain memories, flat panel displays, thin film magnetic heads, etc. The skilled artisan will appreciate that, in the context of such alternative applications, any use of the terms "wafer" or "die" herein may be considered as synonymous with the more general terms "substrate" or "target portion," respectively.

The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

In the lithography environment, the term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate.

Immersion liquids may also be applied to other spaces in the lithographic apparatus, for example, between the mask and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed above and below.

A programmable mirror array may comprise a matrix-addressable surface having a viscoelastic (i.e., a surface having appreciable and conjoint viscous and elastic properties) control layer and a reflective surface. The basic principle behind such an apparatus is that, for example, addressed areas of the reflective surface reflect incident light as diffracted light, whereas unaddressed areas reflect incident light as undiffracted light. The addressing can be binary or through any one or more multiple intermittent angles. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical MEMS devices can also be used in a corresponding manner. Each diffractive optical MEMS device can include a plurality of reflective ribbons that can be deformed relative to one another to form a grating that reflects incident light as diffracted light. This is sometimes referred to as a grating light valve.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronic means. In one example, groups of the mirrors can be coordinated together to be addressed as a single "pixel." In this example, an optical element in a illumination system can form beams of light, such that each beam falls on a respective group of mirrors. This is sometimes referred to as a digital mirror device.

In both of the situations described hereinabove, the array of individually controllable elements can comprise one or more programmable mirror arrays. A programmable liquid crystal display (LCD) array can also be used.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Exemplary Environment for a Patterning Device

Although the patterning device of the present invention can be used in many different environments, as discussed above, a lithographic environment will be used in the description below. This is for illustrative purposes only.

A lithographic apparatus is a machine that applies a desired pattern onto a target portion of an object. The lithographic apparatus can be used, for example, to pattern an object in a biotechnology environment, in the manufacture of ICs, flat panel displays, micro or nano fluidic devices, and other devices involving fine structures. In an IC-based lithographic environment, the patterning device is used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). As discussed above, instead of a mask, in maskless IC lithography the patterning device may comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction. These concepts will be discussed in more detail below.

FIG. 1 schematically depicts a lithographic projection apparatus 100, according to one embodiment of the invention. Apparatus 100 includes at least a radiation system 102, a patterning device 104 (e.g., a static device or an array of individually controllable elements), an object table 106 (e.g., a substrate table), and a projection system ("lens") 108.

Radiation system 102 is used to supply a beam 110 of radiation, which in this example also comprises a radiation source 112.

Array of individually controllable elements 104 (e.g., a programmable mirror array) is used to pattern beam 110. In one example, the position of the array of individually controllable elements 104 is fixed relative to projection system 108. However, in another example, array of individually controllable elements 104 is connected to a positioning device (not shown) that positions it with respect to projection system 108. In the example shown, each element in the array of individually controllable elements 104 are of a reflective type (e.g., have a reflective array of individually controllable elements).

Object table 106 is provided with an object holder (not specifically shown) for holding an object 114 (e.g., a resist coated silicon wafer, a glass substrate, or the like). In one example, substrate table 106 is connected to a positioning device 116 for accurately positioning substrate 114 with respect to projection system 108.

Projection system 108 (e.g., a quartz and/or CaF2 lens system or a catadioptric system comprising lens elements made from such materials, or a mirror system) is used to project the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., an excimer laser, or the like) produces a beam of radiation 122. Beam 122 is fed into an illumination system (illuminator) 124, either directly or after having traversed conditioning device 126, such as a beam expander 126, for example. Illuminator 124 can comprise an adjusting device 128 that sets the outer and/or inner radial extent (commonly referred to as ρ-outer and ρ-inner, respectively) of the intensity distribution in beam 122. In addition, illuminator 124 can include various other components, such as an integrator 130 and a condenser 132. In this way, beam 110 impinging on the array of individually controllable elements 104 has a desired uniformity and intensity distribution in its cross-section.

In one example, source 112 is within the housing of lithographic projection apparatus 100 (as is often the case when source 112 is a mercury lamp, for example). In another example, source 112 is remotely located with respect to lithographic projection apparatus 100. In this latter example, radiation beam 122 is to be directed into apparatus 100 (e.g., with the aid of suitable directing mirrors (not shown)). This latter scenario is often the case when source 112 is an excimer laser. It is to be appreciated that both of these scenarios are contemplated within the scope of the present invention.

Beam 110 subsequently interacts with the array of individually controllable elements 104 after being directed using beam splitter 118. In the example shown, having been reflected by the array of individually controllable elements 104, beam 110 passes through projection system 108, which focuses beam 110 onto a target portion 120 of substrate 114.

With the aid of positioning device 116, and optionally interferometric measuring device 134 on a base plate 136 that receives interferometric beams 138 via beam splitter 140, substrate table 106 is moved accurately, so as to position different target portions 120 in a path of beam 110.

In one example, a positioning device (not shown) for the array of individually controllable elements 104 can be used to accurately correct the position of the array of individually controllable elements 104 with respect to the path of beam 110, e.g., during a scan.

In one example, movement of substrate table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 may alternatively/additionally be moveable, while substrate table 106 and/or the array of individually controllable elements 104 may have a fixed position to provide the required relative movement.

In another example, substrate table 106 may be fixed, with substrate 114 being moveable over substrate table 106. Where this is done, substrate table 106 is provided with a multitude of openings on a flat uppermost surface. A gas is fed through the openings to provide a gas cushion, which supports substrate 114. This is referred to as an air bearing arrangement. Substrate 114 is moved over substrate table 106 using one or more actuators (not shown), which accurately position substrate 114 with respect to the path of beam 110. In another example, substrate 114 is moved over substrate table 106 by selectively starting and stopping the passage of gas through the openings.

The depicted apparatus 100 can be used in at least one of four modes:

1. Step mode: the entire pattern on the array of individually controllable elements 104 is projected during a single exposure (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 moves in a given direction (e.g., a "scan direction," for example, the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary, and the entire pattern is projected onto a target portion 120 of substrate 114 using pulsed radiation system 102. Substrate table 106 is moved with an essentially constant speed, such that patterned beam 110 scans a line across substrate 106. The pattern on the array of individually controllable elements 104 is updated as required between pulses of radiation system 102, and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use may also be employed.

Exemplary Elements in the Array of Programmable Elements

Figure 2:
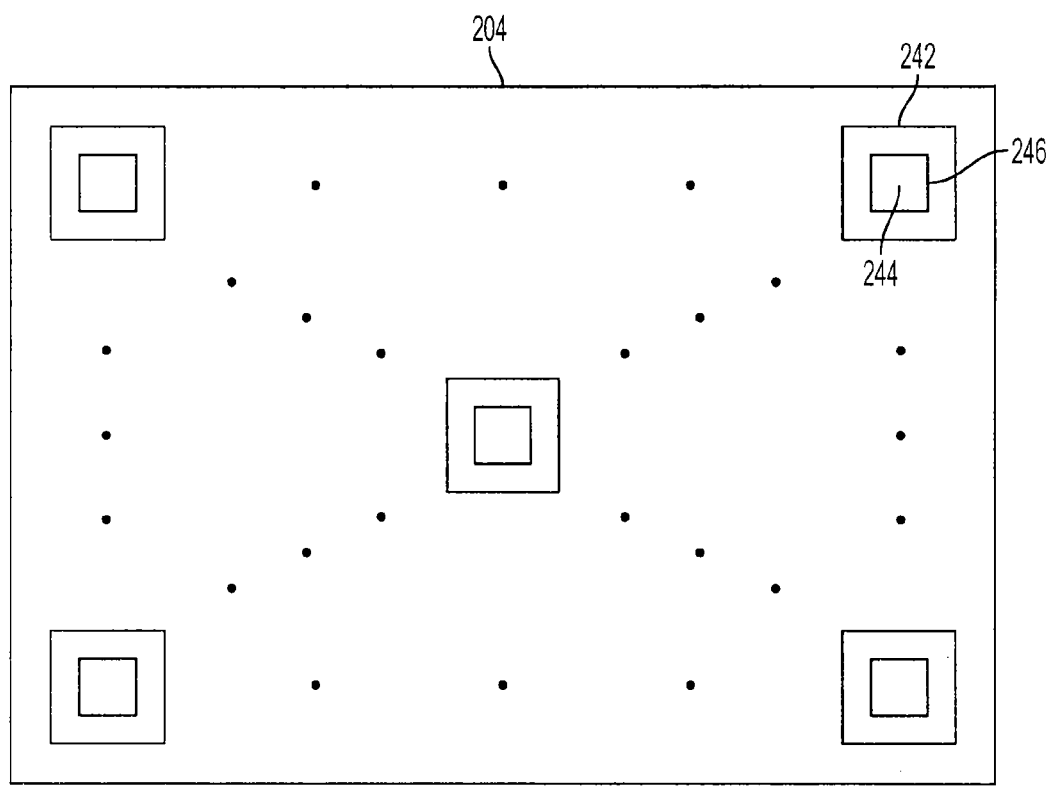
FIG. 2 depicts a patterning device, according to one embodiment of the invention.

FIG. 2 shows a top view of an array of individually controllable elements 204, according to one embodiment of the present invention. Each element 242 in the array of individually controllable elements 204 includes a tilting portion 244 and a non-tilting portion 246. Tilting portion 244 occupies about 60% of the entire area of element 242, as described in more detail below. When held at a default angle (e.g., resting), such that the reflective surface of the tilting portion is substantially parallel to the reflective surface of the non-tilting portion, radiation reflected off the tilting portion is out-of-phase with radiation reflected off the non-tilting portion. The phrase "out-of-phase tilting mirror" will hereinafter be used synonymously with element 242.

In conventional tilting mirrors, by design, portion 246 (i.e., the space between adjacent mirrors in the array of individually controllable elements) is narrow and opaque. In contrast, according to the present invention, portion 246 is 100% reflective and out-of-phase with the tilting portion 244 (when tilting portion 244 is flat, i.e., zero tilt), with the width of the mirror 246 being optimized, as described below.

Figure 3:
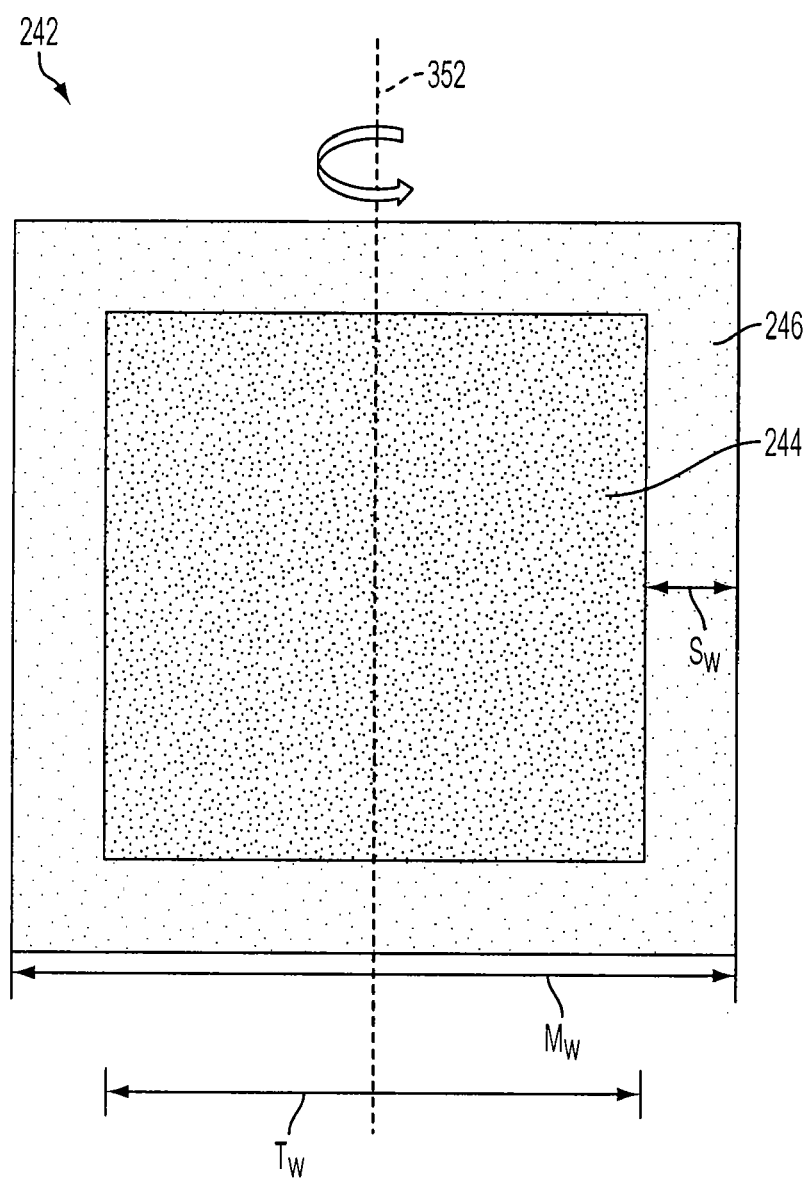
FIGS. 3 and 4 depict a top and side view, respectively, of an element in a patterning device, according to one embodiment of the present invention.
Figure 4:
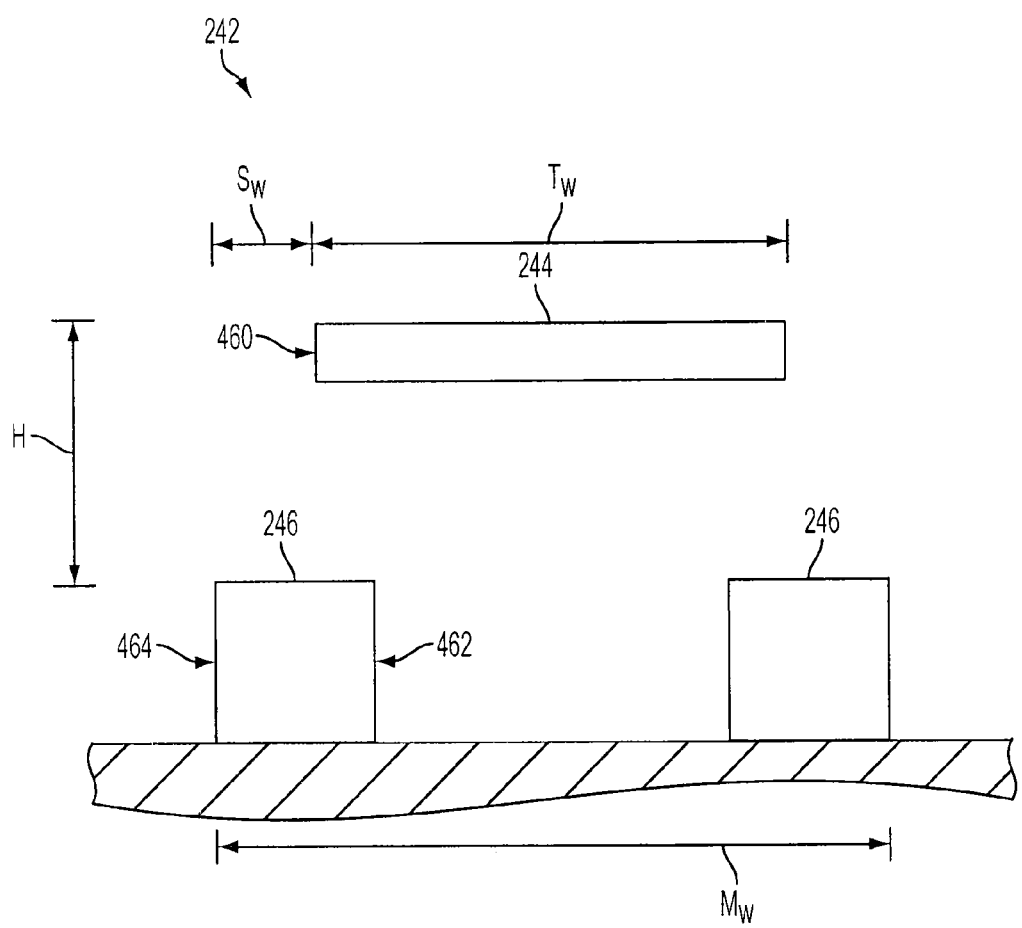
Figure 5:
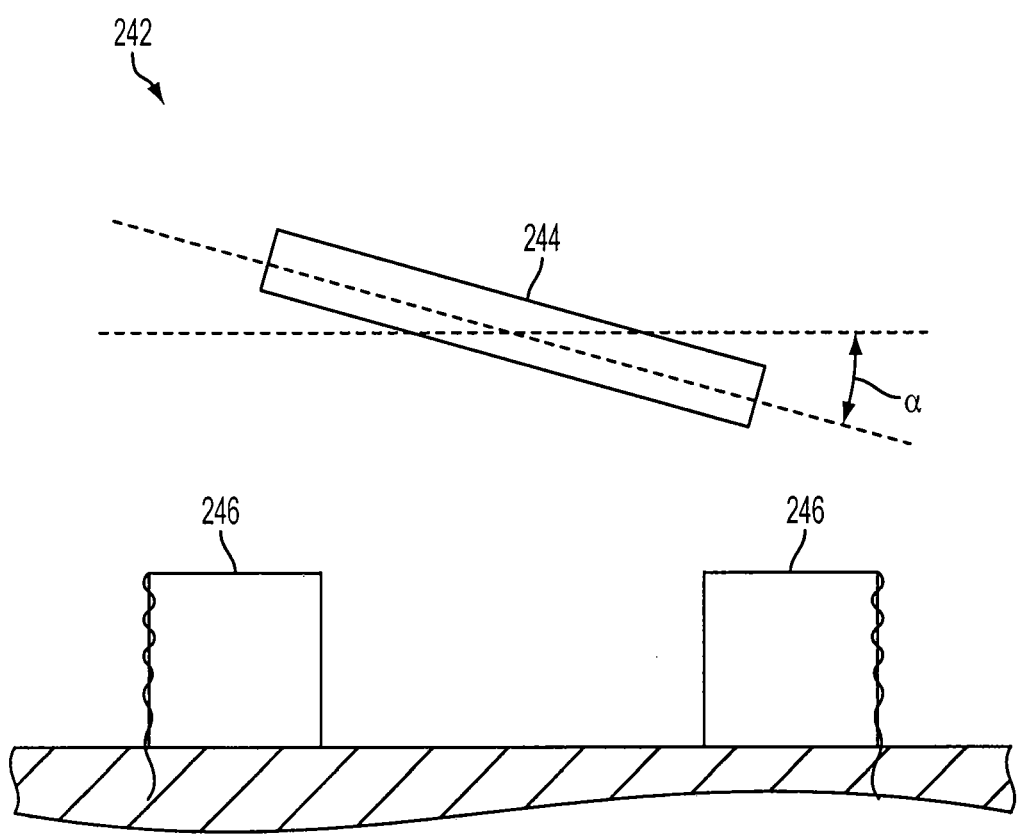
FIG. 5 depicts a side view of an element in a patterning device, according to an embodiment of the present invention.

FIG. 3 is a top view and FIGS. 4 and 5 are side views of an element 242 (e.g., reflective device, mirror, etc.) in an array of controllable elements 204, according to an embodiment of the present invention. Element 242 includes a tilting portion 244 and a non-tilting portion 246. Tilting portion 244 is coupled to a controller (not specifically shown), which controls the tilt of tilting portion 244. Various tilting mechanisms and controllers can be employed, as would become apparent to persons having ordinary skill in the art. The controllers include circuitry that transmits and/or receives data used to control and/or move tilting portion 244. The term "data path" is used hereinafter to refer to the circuitry and/or the data it transmits/receives.

FIG. 3 shows that tilting portion 244 can tilt about a central rotation axis 352 shared by tilting portion 244 and non-tilting portion 246. According to an embodiment of the present invention, FIG. 4 shows that tilting portion 244 partially extends over non-tilting portion 246. That is, periphery 460 of tilting portion 244 extends beyond inner periphery 262 of non-tilting portion 246, but not beyond outer periphery 464 of non-tilting portion 246.

FIG. 4 shows that non-tilting portion 246 is at a height H below tilting portion 244. In a preferred embodiment, H is approximately λ/4, where λ is the wavelength of radiation beam 122 (FIG. 1), so that radiation reflected off of non-tilting portion 246 is 180 degrees out of phase with radiation reflected off of tilting portion 244, when tilting portion 244 is held at the default angle described above. It should be appreciated that the thickness of tilting portion 244 and non-tilting portion 246 are not necessarily drawn to scale.

FIG. 5 shows that any individual tilting portion 244 may only tilt in one direction, i.e., through angle α (shown in FIG. 5). The combination of pairs of unidirectional tilting mirrors (e.g., tilting portion 244) that tilt in opposite directions can help correct telecentricity errors without creating additional strain on the data path, as is described in more detail below.

The width of element 242 is given by $M_W$, the width of the non-tilting portion 246 (as viewed from a top view) is given by $S_W$ and the width of tilting portion 244 is given by $T_W$. It should be noted that $S_W$ is a measure of the width of non-tilting portion 246 as seen from a top view only. In embodiments of the present invention, the relative widths $S_W$ and $T_W$ are sized to obtain equal amplitudes of positive and negative reflected light over a complete range of tilt angles α, where α ranges between a minimum and a maximum value. The minimum value for α is approximately equal to 0 and the maximum value for α is approximately equal to $\lambda/2M_W$, where again λ is the wavelength of radiation beam 122.

In an example embodiment, the width of non-tilting portion 246 is approximately 7.6% of the width $M_W$ of element 242. In other words, the projected area of non-tilting portion 246 (i.e., the area that non-tilting portion 246 appears to be when projected onto a target) is approximately 28.3% of the projected area of element 242.

In various examples, using appropriate tilt angles, element 242 can emulate Binary masks, attenuating phase-shift masks (Att PSMs) and alternating phase-shift masks (Alt PSMs). PSMs have transmissive areas that are in or out of phase with respect to each other. When two transmissive areas are out of phase with respect to each other, images at an image plane are made sharper. Thus, through appropriate selection of widths $S_W$ and $T_W$, and by tilting portion 246 through an appropriate range of angles, element 244, when used in array 104 (FIG. 1) or 204 (FIG. 2), for example, can emulate any one of these phase shifting masks, which allows for a sharper image to be formed at an image plane (not shown) than conventional mirrors discussed above and below. It should be particularly noted, that when used as described above, element 244 can emulate Alt PSM, which cannot be done with conventional flat tilting mirrors. Emulating Alt PSM results in better depth of focus and exposure latitude.

Figure 6:
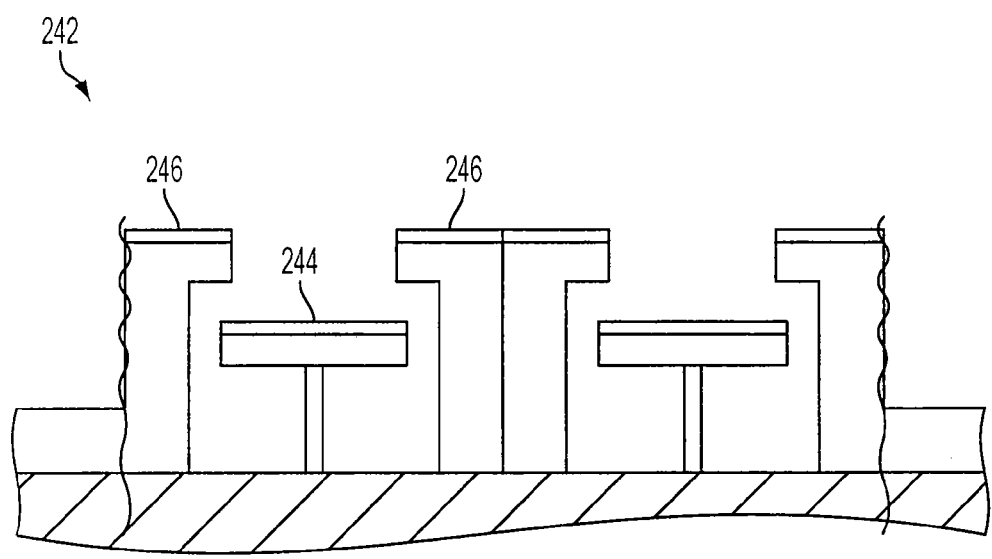
FIG. 6 depicts a side view of several elements in a pattering device, according to an alternative embodiment of the present invention.

FIG. 6 depicts an alternative embodiment of element 242. In this embodiment, tilting portion 244 is positioned below non-tilting portion 246, such that the height from the reflective surface of non-tilting portion 246 to the reflective surface of tilting portion 244 is approximately λ/4. Alternatively, the height between the reflective surfaces of tilting portion 244 and non-tilting portion 246 can be different from λ/4.

Figure 7:
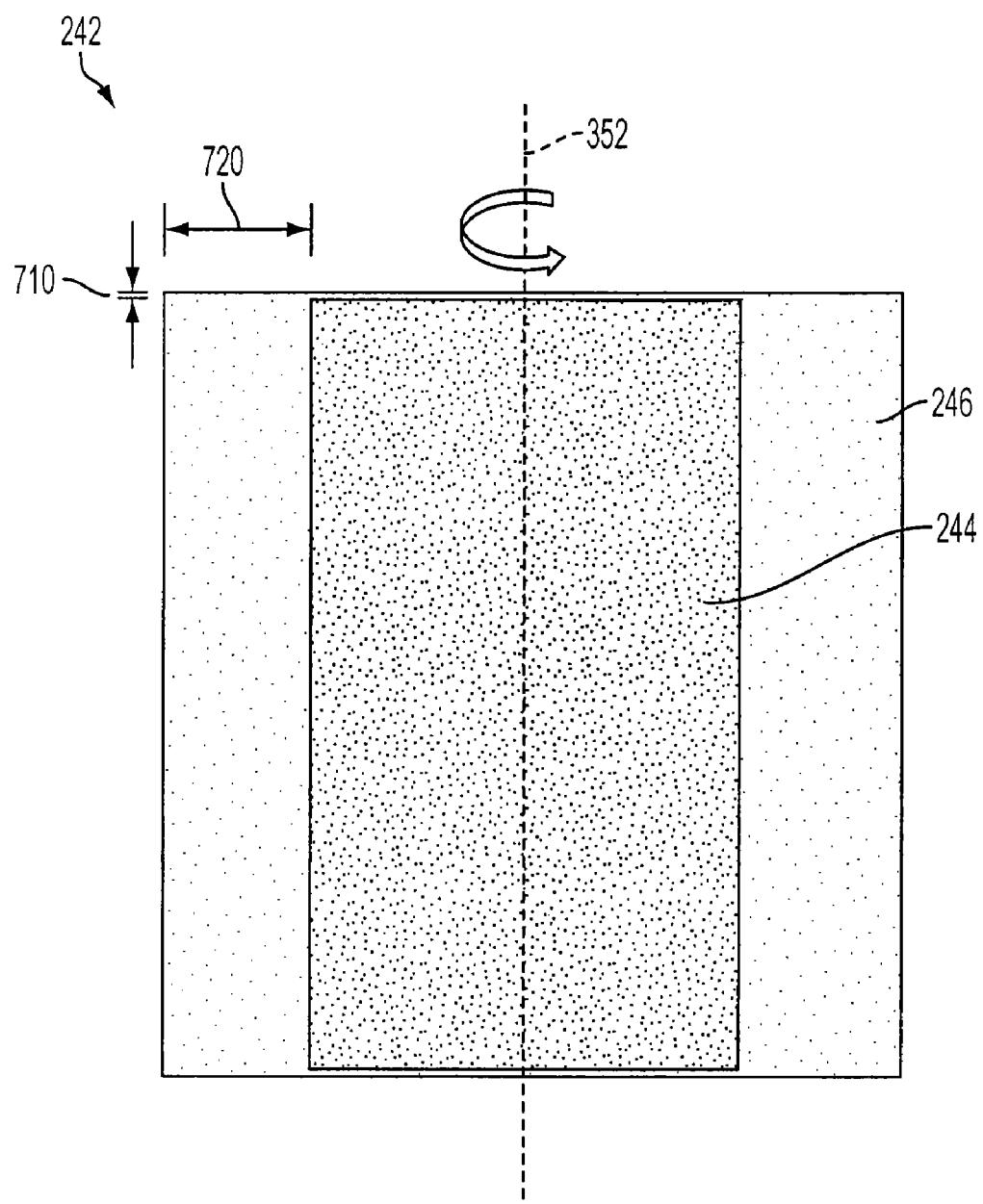
FIG. 7 depicts a top view of an element in a patterning device, according to an alternative embodiment of the present invention.

FIG. 7 depicts a top view of another alternative embodiment of element 242. In this alternative embodiment, tilting portion 244 is not symmetrically bounded by non-tilting portion 246; i.e., a width 720 of non-tilting portion 246 is not equal to a height 710 of non-tilting portion 246, as seen in FIG. 7. It should be appreciated, however, that the dimensions shown in FIG. 7 are exemplary dimensions and are not necessarily drawn to scale. For example, height 710 could be larger than width 720.

In one example, a size of assist features (e.g., features intended to improve lithography on a customer wafer, for example, optical proximity correction features, serifs, hammerheads, scattering bars, anti-scattering bars, etc.) that can be replicated with active element 244 is only limited by the pixel size $M_W$. In contrast, when using conventional piston mirrors a smallest assist feature cannot be less than the size of the coupled mirrors, e.g., at least twice the pixel size.

Exemplary Reflectance Characteristics of Out-of-Phase Tilting Mirrors

Figure 8:
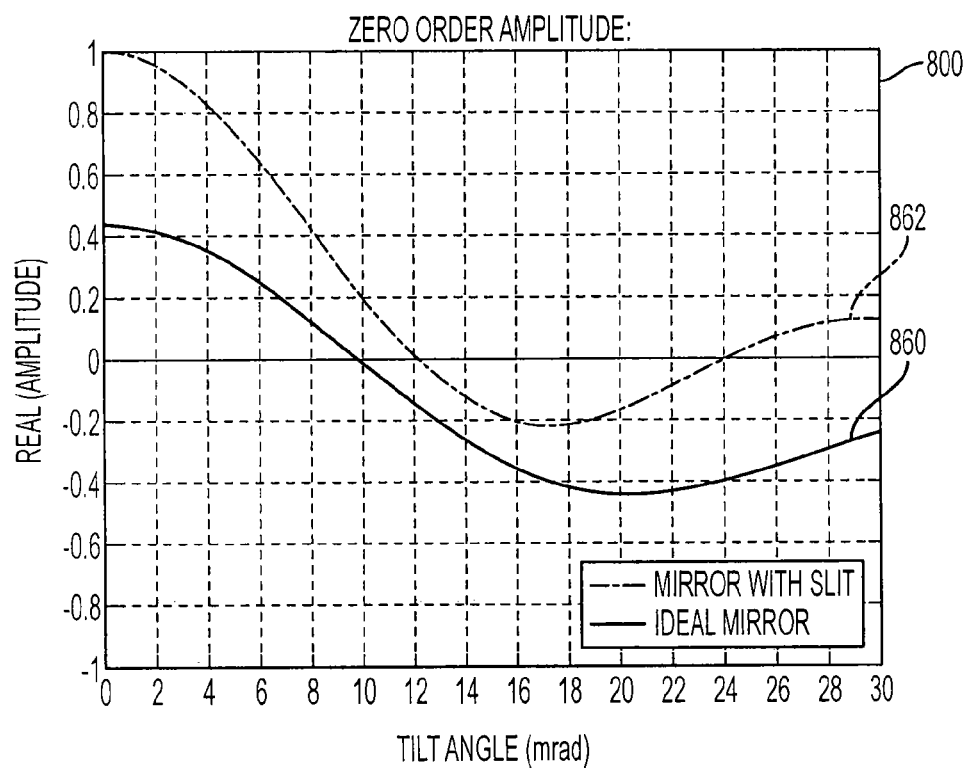
FIG. 8 is a graph depicting reflectivity over a range of tilt angles of elements in a patterning device, according to an embodiment of the present invention.

FIG. 8 shows a graph that depicts reflectivity over a range of tilt angles for a conventional tilting mirror as compared to an out-of-phase tilting mirror, according to embodiments of the present invention. In graph 800 curve 862 is a reflectivity curve produced by using a conventional flat tilting mirror and curve 860 is a reflectivity curve produced by using an out-of-phase tilting mirror, as described in a preferred embodiment of the present invention.

Conventional flat tilting mirrors can achieve an intensity modulation anywhere between 100% positive phase intensity and 4.7% negative phase intensity. This is shown in FIG. 8 in curve 862. This limited negative phase intensity has proven to be a major limitation in conventional flat tilting mirrors emulating alternating phase-shifting masks without significant light loss.

In contrast, according to the present invention, using element 242, and optimizing the relative widths of tilting portion 244 and non-tilting portion 246 (FIGS. 2-5) comprised therein, produces a reflectivity curve with equal positive and negative maximum amplitudes as show in FIG. 8 curve 860. As seen in FIG. 8, in an example embodiment, the maximum positive amplitude is achieved at zero tilt (about 0.45 amplitude or 20% intensity) while the maximum negative amplitude is obtained at approximately 20 mrad (approximately negative 0.45 amplitude or negative 20% intensity). The reflectivity zero crossing occurs at approximately 10 mrad. FIG. 8 demonstrates that element 242, when used in array 104 (FIG. 1) or 204 (FIG. 2), can emulate binary, Att PSM and Alt PSM reticles. The light loss when emulating Alt PSM masks is 15% less compared to what would be needed with a standard flat tilting mirror, as shown in curve 862.

The amplitude of the mirror reflectivity or graytone associated with the out-of-phase tilting mirror (i.e. element 242) is given by:

$$A(\alpha) = \left(1 - 2\frac{S_w}{w}\right)^2 \mathrm{sinc}\left(\frac{2\alpha M w}{\lambda} \cdot \left(1 - 2\frac{S_w}{w}\right)\right) + 4\frac{S_w}{w} \cdot \left(1 - \frac{S_w}{w}\right) \cdot \sqrt{S_R} \cdot \exp(iS_\varphi),$$

where M is the demagnification of the optical system, w is the pixel size on wafer scale (actual mirror width/M), α is the tilt angle, $S_W$ is the width of the non-tilting portion as seen from a top view, $S_R$ is the intensity reflectivity of the non-tilting portion, $S_\phi$ is the non-tilting portion phase with respect to the tilting portion, and λ is the imaging wavelength.

Correcting telecentricity errors for an array of out-of-phase tilting mirrors (e.g., array 204 in FIG. 2) is carried out in the same way as for a conventional flat tilting mirror, i.e., by alternating the sign of the tilt angle in a checkerboard fashion, for example. Unlike, the single phase step mirror, correcting for the telecentric error with the out-of-phase slit tilting mirror will result in no additional burden on the data path. In addition, there is no added phase step on the mirror surface as in the single phase step mirror, and therefore there is no introduced asymmetric deformation of the mirror surface.

Because of the symmetry of the slit diffraction pattern, for any given mirror in an array of out-of-phase tilting mirrors, tilting can be restricted to one direction only and still results in both negative and positive amplitudes. This has the advantage of providing a simple scheme for correcting non-telecentricity by simply alternating the sign of the tilt angle, as discussed above. This is to be compared with the single step mirror that requires each mirror to tilt in both directions, making the biasing CMOS design more complicated. In addition, the phase step position has to be alternated from mirror to mirror to minimize telecentricity errors making mirror addressing more complicated since the mirror graytones depend on the sign of the tilt angle and the step position.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. A system, comprising:
   an illumination system that supplies a beam of radiation having a wavelength;
   an array of individually controllable elements that patterns the beam, each individually controllable element comprising a tilting portion and a non-tilting portion displaced from the tilting portion by a predetermined distance equal to a fraction of the wavelength; and
   a projection system that projects the patterned beam onto a target portion of an object,
   wherein the displacement causes radiation reflected by the tilting portion and the non-tilting portion to be out of phase in accordance with the fraction of the wavelength.

2. The system of claim 1, wherein the system is at least one of a maskless lithography system, a projector, and a projection display system.

3. The system of claim 1, wherein:
   each of the non-tilting portions has a first reflective surface that is bounded by an inner periphery and outer periphery;
   each of the tilting portions has a second reflective surface that is bounded by a periphery; and
   each of the respective tilting portions is oriented with respect to the respective non-tilting portions so that the periphery of the respective tilting portions extends beyond the inner periphery of the respective non-tilting portions, but not beyond the outer periphery of the respective non-tilting portions.

4. The system of claim 3, wherein the respective tilting portions tilt about a central axis shared by the respective tilting portions and respective non-tilting portions.

5. The system of claim 1, wherein each of the respective tilting portions can be tilted through a complete range of tilt angles to produce substantially equal positive and negative maximum amplitudes of projected radiation at the target portion over the complete range of tilt angles.

6. The system of claim 1, wherein each respective tilting portion one of tilts through a positive range of tilt angles and a negative range of tilt angles, wherein a zero tilt angle is such that a first reflective surface of the non-tilting portion is substantially parallel to a second reflective surface of the tilting portion.

7. The system of claim 6, wherein at the zero tilt angle radiation reflected from the non-tilting portion is out-of-phase with radiation reflected from the tilting portion.

8. The system of claim 1, wherein each one of the respective tilting portions is tilted to a respective tilt angle so that the array of individually controllable elements emulates at least one of a binary reticle, an attenuating phase shift reticle, and an alternating phase shift reticle.

9. The system of claim 1, wherein the object is at least one of a substrate and a display device.

10. The system of claim 9, wherein the substrate comprises at least one of glass, a polymer, and a semiconductor material.

11. A patterning device for patterning incident radiation, comprising:
   an array of first reflective portions, each of the first reflective portions having a first area;

an array of second reflective portions, each of the second reflective portions having a second area, wherein each of the second reflective portions can tilt through a predetermined range of tilt angles about an axis shared by the first reflective portions and the second reflective portions, respectively, and wherein each first reflective portion is displaced from a corresponding second reflective portion by a predetermined distance equal to a fraction of a wavelength $\lambda$ of the incident radiation causing radiation reflected thereby to be out of phase in accordance with the fraction of the wavelength $\lambda$; and an array of controllers coupled to one of respective ones of the second reflective portions and subsets of the second reflective portions, each of the controllers controlling the tilt angle of one of the respective ones of the second reflective portions and subsets of the second reflective portions.

12. The patterning device of claim 11, wherein:

each of the first areas of the first reflective portions is bounded by an inner and outer periphery;

each of the second areas of the second reflective portions is bounded by a periphery; and each of the respective second reflective portions is oriented with respect to the respective first reflective portions such that the periphery of the respective second reflective portions extends beyond the inner periphery of the respective first reflective portions, but not beyond the outer periphery of the respective first reflective portions.

13. The patterning device of claim 11, wherein each respective second reflective portion one of tilts through a positive range of tilt angles and a negative range of tilt angles, wherein a zero tilt angle is such that a second reflective surface of the respective second reflective portions is substantially parallel to a first reflective surface of the respective first reflective portions.

14. The patterning device of claim 11, wherein the axis shared by the respective first and second reflective portions is a central longitudinal axis that is substantially parallel to a reflective surface of the respective first reflective portions.

15. The patterning device of claim 12, wherein the axis shared by the respective first and second reflective portions is substantially parallel to a substrate that supports the array of first reflective portions.

16. The patterning device of claim 11, wherein if the respective tilt angle of the respective second reflective portion is equal to a default value, a first reflective surface of the respective first reflective portion is substantially parallel to a second reflective surface of the respective second reflective portion.

17. The patterning device of claim 11, wherein:

the first reflective portion is mounted on a substrate;

the second reflective portion is supported above the substrate such that a height measured from a first reflective surface of the first reflective portion to a second reflective surface of the second reflective portion is approximately $\lambda/4$ when the second reflective portion is substantially parallel to the substrate.

18. The patterning device of claim 11, wherein:

the first reflective portion is mounted on a substrate;

the second reflective portion is supported above the substrate such that a first reflective surface of the first reflective portion is above a second reflective surface of the second reflective portion and a height measured from the first reflective surface of the first reflective portion to the second reflective surface of the second reflective portion is approximately $\lambda/4$ when the second reflective surface is substantially parallel to the substrate.

19. The patterning device of claim 11, wherein each of the respective second reflective portions is tilted to a respective predetermined tilt angle so that the patterning device emulates at least one of a binary reticle, an attenuating phase shift reticle, and an alternating phase shift reticle.

20. A method, comprising:

patterning a beam of radiation using an array of individually controllable elements, each of the individual elements in the array having a first reflective region that tilts and a second reflective region; and projecting the patterned beam onto a target portion of an object, wherein each element produces substantially equal positive and negative maximum amplitudes of reflected radiation over a complete range of tilt angles.

21. The method of claim 20, further comprising emulating at least one of a binary reticle, an attenuating phase shift reticle, and an alternating phase shift reticle using the array of individually controllable elements.

22. The method of claim 20, wherein the projecting step comprises projecting the patterned beam onto a target portion of at least one of a substrate, a semiconductor substrate, a glass substrate, a polymer substrate, and a display device.

23. The method of claim 20, wherein the patterning step comprises:

patterning a beam of radiation using an array of individually controllable elements, each of the individual elements in the array having a first reflective region that tilts and a second reflective region, wherein the first reflective region and the second reflective region are non-coplanar for all angles through which the first reflective region tilts.

24. A system, comprising:

an illumination system that supplies a beam of radiation;

an array of individually controllable elements that patterns the beam, wherein each of the elements in the array of individually controllable elements comprises a tilting portion and a non-tilting portion, each of the non-tilting portions having a first reflective surface that is bounded by an inner periphery and outer periphery, each of the tilting portions having a second reflective surface that is bounded by a periphery, and each of the respective tilting portions being oriented with respect to the respective non-tilting portions so that the periphery of the respective tilting portions extends beyond the inner periphery of the respective non-tilting portions, but not beyond the outer periphery of the respective non-tilting portions; and a projection system that projects the patterned beam onto a target portion of an object;

wherein the first reflective surfaces of the respective non-tilting portions are sized to a predetermined percentage of an area of the respective elements so as to produce substantially equal positive and negative maximum amplitudes at the target portion over a complete range of tilt angles.

25. A patterning device, comprising:

an array of first reflective portions, each of the first reflective portions having a first area;

an array of second reflective portions, each of the second reflective portions having a second area, wherein each of the second reflective portions can tilt through a predetermined range of tilt angles about an axis shared by the first reflective portions and the second reflective portions, respectively, and wherein the first reflective portions and the second reflective portions are non-coplanar for all tilt angles; and an array of controllers coupled to one of respective ones of the second reflective portions and subsets of the second reflective portions, each of the controllers controlling the tilt angle of one of the respective ones of the second reflective portions and subsets of the second reflective portions;

wherein a ratio of the area of the respective second reflective portions to the area of the respective first reflective portions produces substantially equal positive and negative maximum amplitudes of reflected radiation over a complete range of tilt angles.

* * * * *